(12) United States Patent
Chen et al.

(10) Patent No.: US 12,432,870 B2
(45) Date of Patent: Sep. 30, 2025

(54) BUCKLING DEVICE AND CHASSIS

(71) Applicant: Fulian Precision Electronics (Tianjin) Co., LTD., Tianjin (CN)

(72) Inventors: Hung-Wei Chen, New Taipei (TW); Yu-Yong Huang, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 151 days.

(21) Appl. No.: 18/413,253

(22) Filed: Jan. 16, 2024

(65) Prior Publication Data
US 2025/0016945 A1    Jan. 9, 2025

(30) Foreign Application Priority Data
Jul. 7, 2023   (CN) .......................... 202310839607.8

(51) Int. Cl.
*H05K 7/14*    (2006.01)
(52) U.S. Cl.
CPC ......... *H05K 7/1401* (2013.01); *H05K 7/1488* (2013.01)
(58) Field of Classification Search
CPC ...................................................... H05K 7/14
See application file for complete search history.

(56) References Cited

U.S. PATENT DOCUMENTS

2009/0139145 A1\*  6/2009  Watanabe ............. E05D 15/502
                                                                49/193
2015/0085451 A1\*  3/2015  Yu ........................... G06F 1/185
                                                                361/747

FOREIGN PATENT DOCUMENTS

CN            1144118 C      3/2004

\* cited by examiner

*Primary Examiner* — Jerry Wu
(74) *Attorney, Agent, or Firm* — ScienBiziP, P.C.

(57) ABSTRACT

Disclosed in the present application is a buckling device and a chassis. The buckling device includes a first main body, a snap member, and a sliding member. The first main body is configured to be fixed within a box. The snap member is configured to be connected to a functional component. The sliding member is slidably connected to the first main body. The snap member is rotationally connected to the first main body and held against the sliding member, and the snap member is configured to drive the sliding member to slide during rotation, and the snap member is buckled and connected to the first main body when the sliding member is located at a first preset position protruding outside the box. When an area near a functional component needs to be avoided, rotate the snap member and drive the functional component to rotate to expose the avoidance space.

13 Claims, 10 Drawing Sheets

BUCKLING DEVICE AND CHASSIS

FIELD

The present disclosure relates to the technical field of servers, and specifically to a buckling device and chassis.

BACKGROUND

There are many components in various types of servers which are connected inside the chassis, and secured inside the chassis by snap-fit connections or threaded connections. When a component needs to be repaired or replaced, it is necessary to dismantle some other component to make room for the repair or replacement. When the work is completed, the dismantled component) may be omitted to be installed back into the chassis.

Therefore, improvement is desired.

DETAILED DESCRIPTION

In the description of the embodiments of the present disclosure, the technical terms "first," "second," and the like are only used to distinguish different objects, and are not to be construed as indicating or implying relative importance, or implicitly specifying the number, specific order, or primary-secondary relationship of the indicated technical features. In the description of the embodiments of the present disclosure, "more than one" means more than two, unless otherwise expressly and specifically limited.

In the embodiments of the present application, the terms "exemplary" or "for example" are used to denote examples, illustrations, or descriptions, any embodiment or design solution described as "exemplary" or "for example" in the embodiments of the present application should not be construed as being preferred or advantageous over other embodiments or design solutions. The use of the terms "exemplary" or "for example" is intended to present the concepts in a concrete manner.

The present application provides a buckling device. The buckling device includes a first main body, a snap member, and a sliding member. The first main body is configured to be fixed within a box. The snap member is configured to be connected to a functional component. The sliding member is slidably connected to the first main body. The snap member is rotationally connected to the first main body and held against the sliding member, and the snap member is configured to drive the sliding member to slide during rotation, and the snap member is buckled and connected to the first main body when the sliding member is located at a first preset position protruding outside the box. When an area near a functional component needs to be avoided, rotate the snap member and drive the functional component to rotate to expose the avoidance space.

The buckling device is connected to the functional component through the snap member, and the snap member is rotationally connected to the first main body. When the area near the functional component needs to be avoided, the snap member is rotated to drive the functional component to rotate to expose the avoidance space. The functional component does not need to be disassembled from the box, thus avoiding the problem of missing the functional component when reassembling the chassis after avoidance. The snap member is securely connected to the first main body, thereby allowing the buckling device to fix the functional component and stably expose the avoidance space, the sliding member extends out of the box and is visualized outside the box to remind the functional component to the avoidance state.

Embodiments of the present disclosure are further described below in conjunction with the accompanying drawings.

Figure 1:
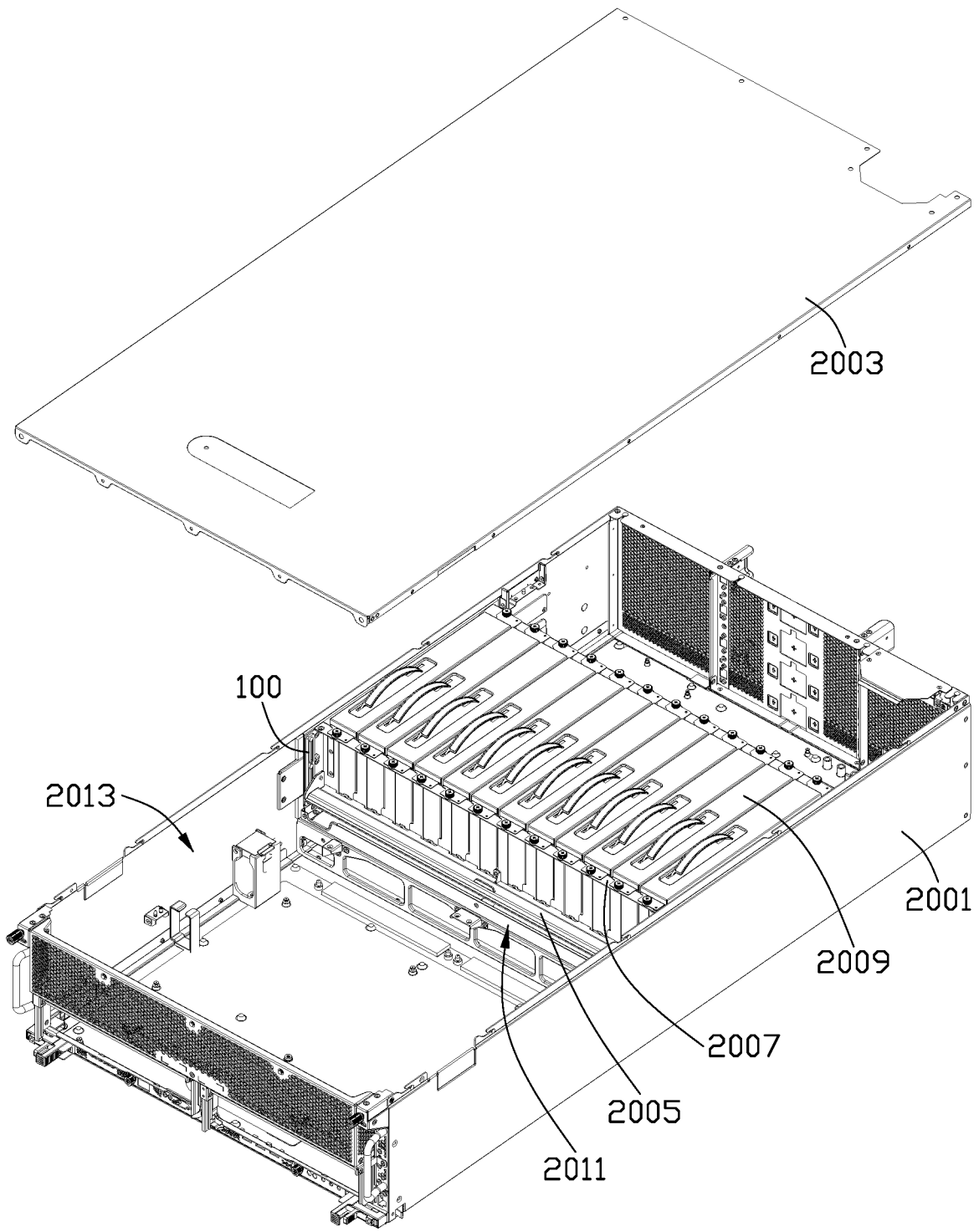
FIG. 1 is a schematic diagram of a chassis according to an embodiment of the present disclosure.
Figure 2:
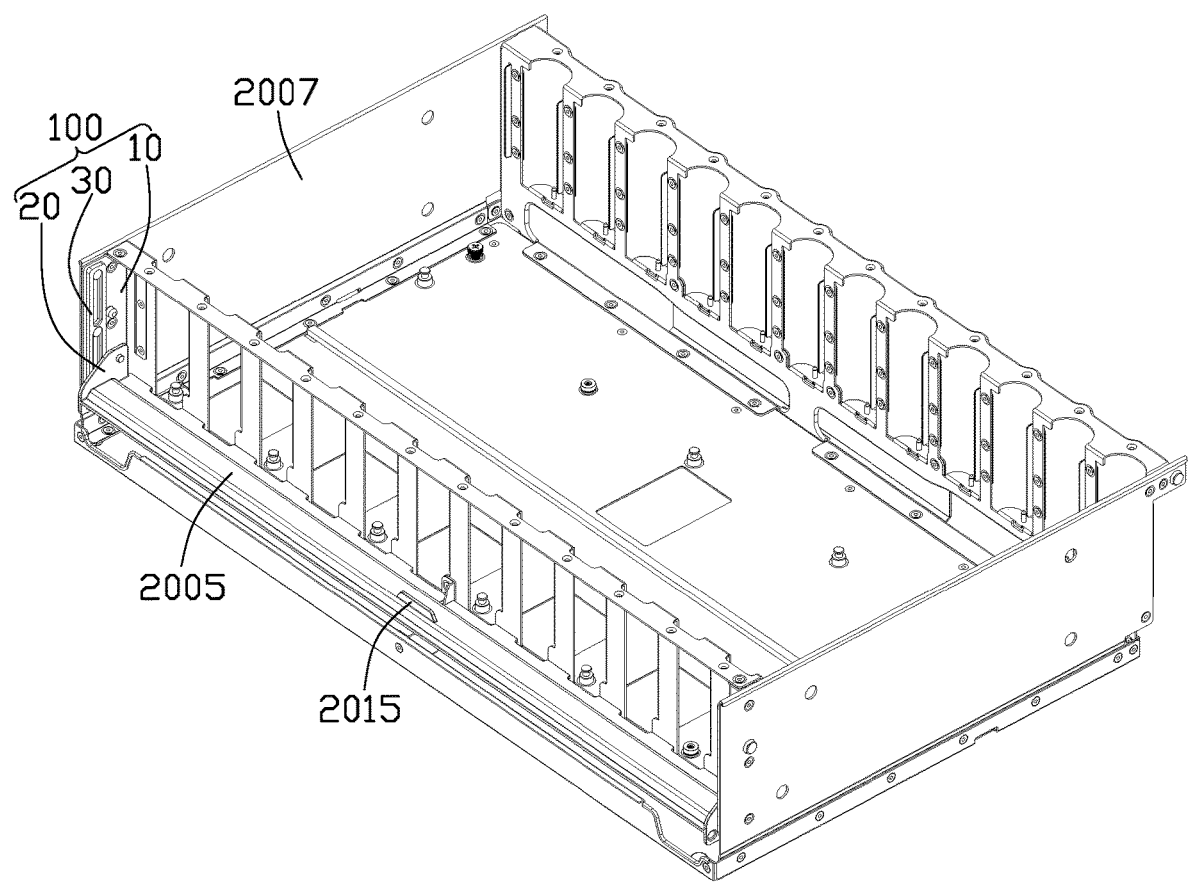
FIG. 2 is a schematic diagram of a buckling device in the chassis shown in FIG. 1.

FIGS. 1 and 2 illustrate a chassis 200 in accordance with an embodiment of the present disclosure.

The chassis 200 includes a box 2001, a cover 2003, a functional component 2005, and a buckling device 100.

The box 2001 defines an opening 2013 and an accommodating cavity 2011. The opening 2013 is connected to the accommodating cavity 2011, and the functional component 2005 is installed in the accommodating cavity 2011 of the box 2001 through the buckling device 100. The cover 2003 is communicated with the opening 2013 of the box 2001.

In one embodiment, the functional component 2005 can be, but is not limited to, a wind deflector.

In one embodiment, the 200 further includes a bracket 2007 and a graphics processing unit (GPU) module 2009. The bracket 2007 is installed inside the box 2001, and the bracket 2007 carries and fixes the GPU module 2009.

The functional component 2005 is installed on the bracket 2007 through the buckling device 100, and the functional component 2005 is located on one side of the GPU module 2009. The functional component 2005 is used to guide the airflow through the GPU module 2009 or other electrical control components inside the box 2001.

Figure 3:
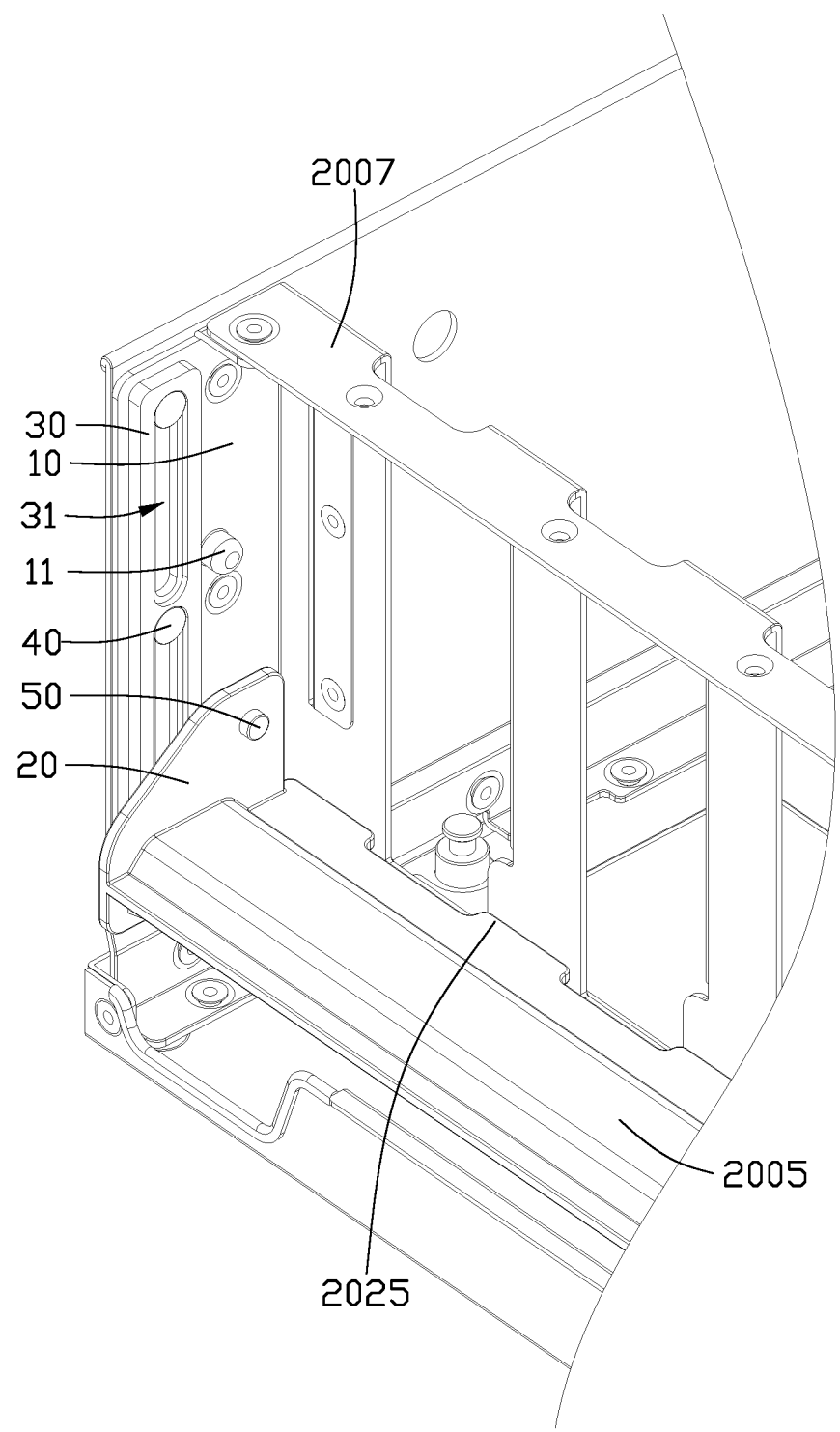
FIG. 3 is a schematic diagram of a functional component connected to the buckling device in an installation state according to an embodiment of the present disclosure.
Figure 4:
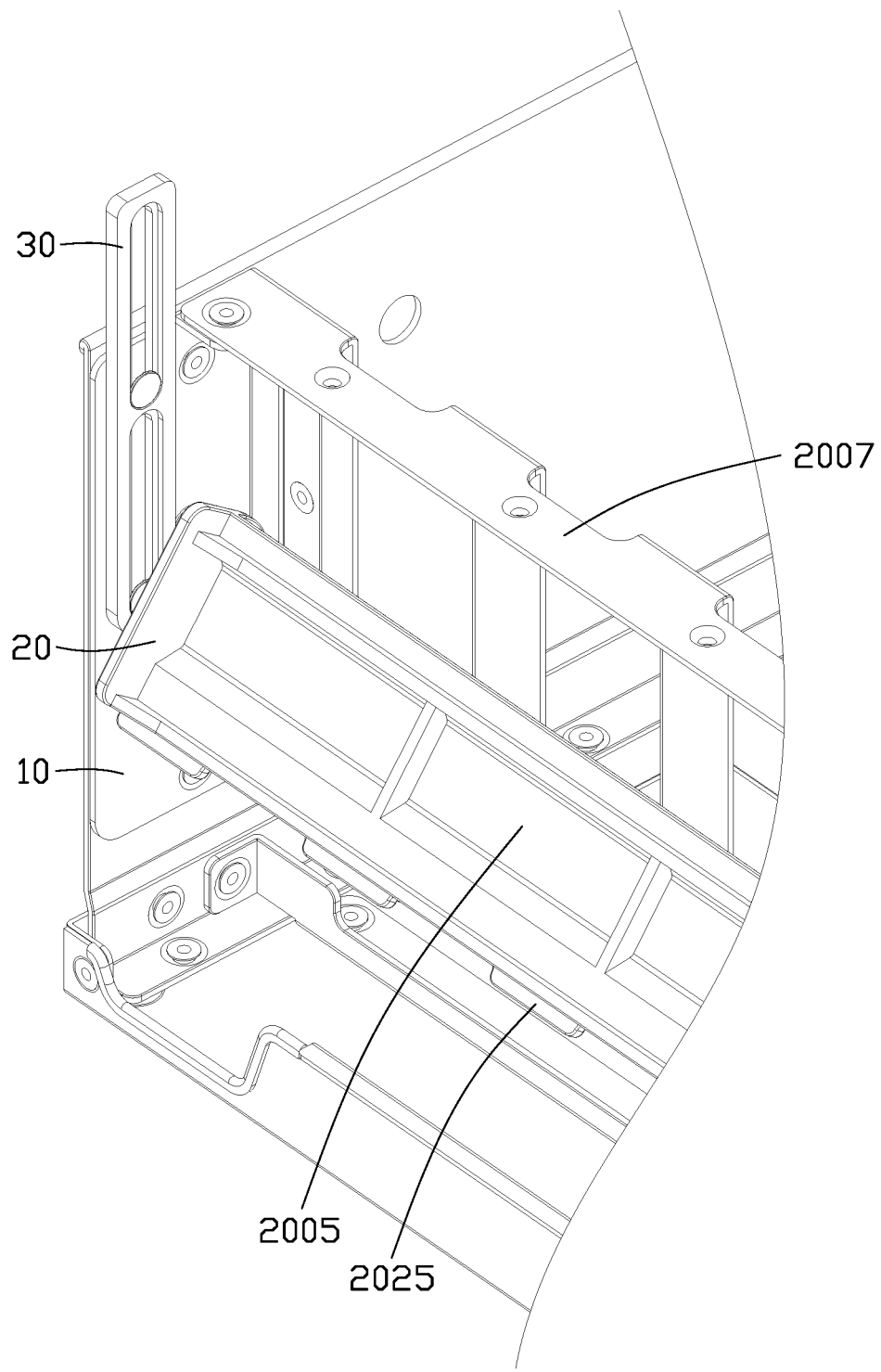
FIG. 4 is a schematic diagram of the functional component connected to the buckling device in a wall yielding state according to an embodiment of the present disclosure.

Referring to FIG. 3 and FIG. 4, the buckling device 100 includes at least one first main body 10, at least one sliding member 30, and at least one snap member 20. The first main body 10 is formed on the bracket 2007.

In one embodiment, the number of the first main body 10, the sliding member 30, and the snap member 20 is two, two first main bodies 10 are located at opposite ends of the bracket 2007. A first main body 10, a sliding member 30, and a snap member 20 are matched as a group. The sliding member 30 is located between the first main body 10 and the snap member 20.

The snap member 20 is used to connect the functional component 2005. The sliding member 30 is slidably connected to the first main body 10. The snap member 20 is rotationally connected to the first main body 10, and the snap member 20 is held against the sliding member 30. The snap member 20 is configured to drive the sliding member 30 to slide during rotation. When the sliding member 30 slides to a first preset position, the snap member 20 is engaged and connected to the first main body 10. When the sliding member 30 is in the first preset position, the sliding member 30 protrudes outside the box 2001.

The snap member 20 is rotated by applying a force to the functional component 2005 or to the snap member 20, the snap member 20 can remain held against the sliding member 30 during rotation, and the sliding member 30 is stressed and slidable relative to the first main body 10.

In one embodiment, the functional component 2005 is integrated with the snap member 20.

In other embodiments, the number of the first main body 10, the sliding member 30, and the snap member 20 may be one each.

The buckling device 100 is connected to the functional component 2005 through the snap member 20, and the snap member 20 is rotationally connected to the first main body 10. When the area near the functional component 2005 needs to be avoided, the snap member 20 is rotated to drive the functional component 2005 to rotate to expose the avoidance space, while the snap member 20 is engaged and connected to the first main body 10, so that the buckling device 100 can fix the functional component 2005 to stably expose the avoidance space. The functional component 2005 does not need to be disassembled from the chassis 200, thus avoiding the problem of missing the functional component 2005 when reassembling the chassis 200 after avoidance. The sliding member 30 extends out of the box 2001 and is visualized outside the box 2001 to remind the functional component 2005 that it is not installed properly.

In other embodiments, the first main body 10 and the bracket 2007 may be two separate structures, and the bracket 2007 may be directly connected to the inner wall of the box 2001.

Figure 5:
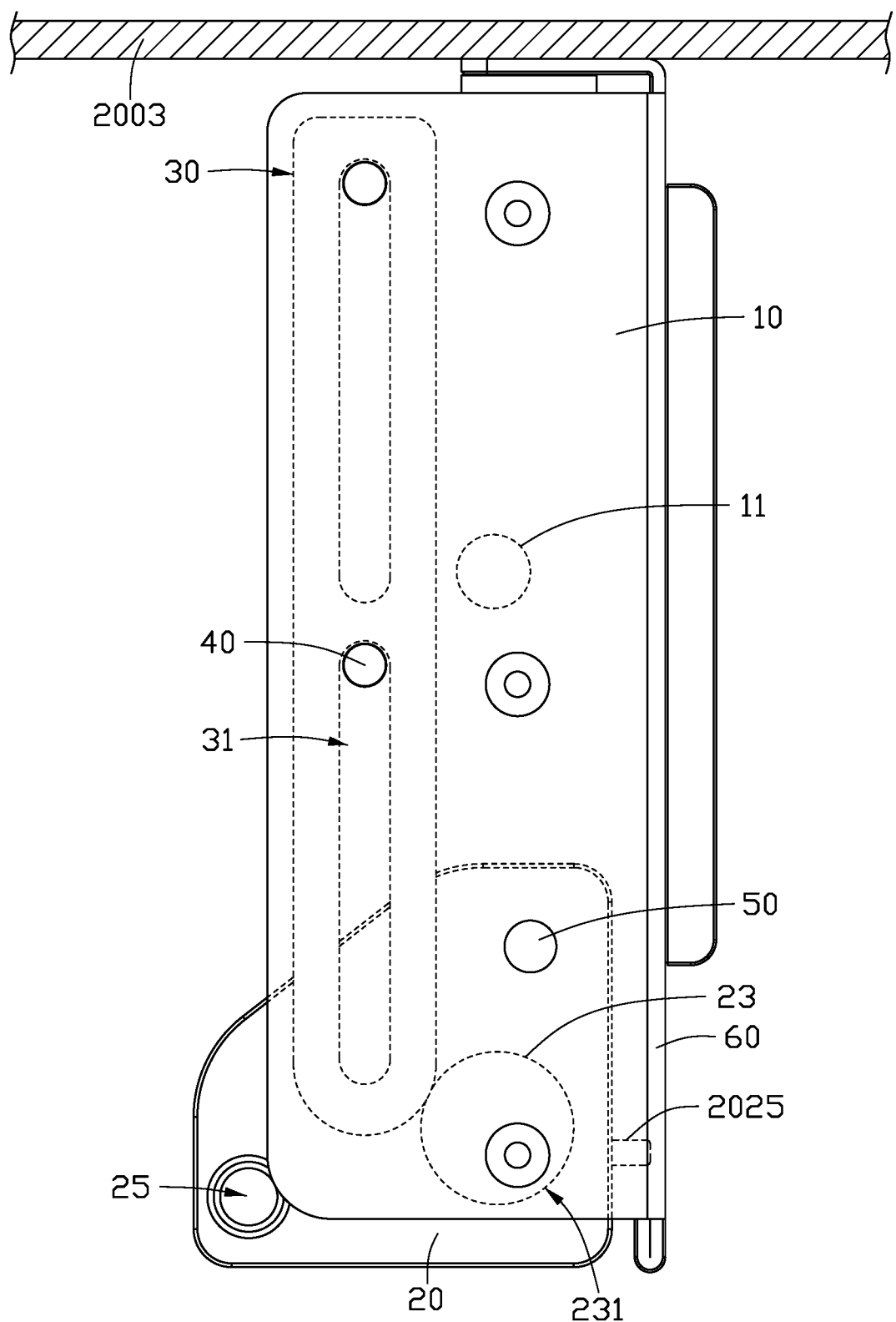
FIG. 5 a simplified schematic diagram, according to an embodiment of the present disclosure, of a sliding member in the buckling device when the sliding member is pressed and fixed by a cover.
Figure 6:
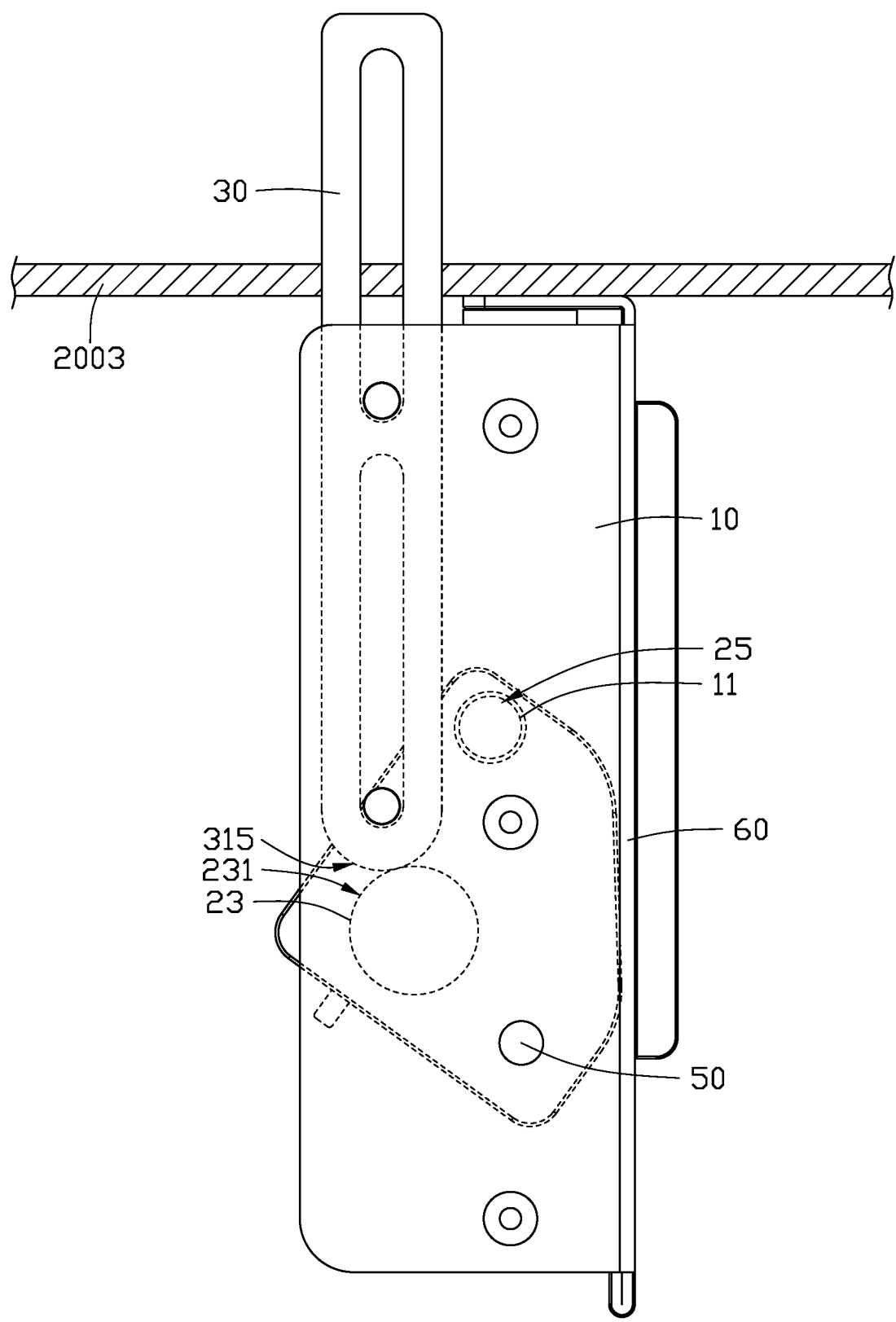
FIG. 6 a simplified schematic diagram, according to an embodiment of the present disclosure, of the sliding member protruding from outside of the chassis in the buckling device.

Referring to FIG. 5 and FIG. 6, in one embodiment, the cover 2003 is connected to the box 2001 and the cover 2003 can hold down and fix the sliding member 30. The cover 2003 holds down and fixes the sliding member 30 when it is connected to the box 2001, thereby improving the stability of the position of the sliding member 30 and avoiding movement of the sliding member 30 or the snap member 20 that could damage other structures within the box 2001. When installing the cover 2003, the cover 2003 moves towards the box 2001 and applies pressure to the sliding member 30, causing the snap member 20 to disconnect from the first main body 10, even if the buckling device 100 is not restored to its closed state first, the position of the buckling device 100 inside the box 2001 can be restored by installing the box 2001, avoiding the problem of reinstalling the wrong position of the buckling device 100 only after the installation of the box 2001.

In one embodiment, when the cover 2003 is connected to the box 2001, the snap member 20 and the cover 2003 are respectively held against the opposite ends of the sliding member 30, thereby stabilizing the sliding member 30 in the second preset position. The buckling device 100 further includes a second main body 60. The second main body 60 is fixed inside the box 2001, and the second main body 60 is integrated with the first main body 10. The first main body 10 extends to one side of the second main body 60, and two first main bodies 10 are disposed at both ends of the second main body 60. When the cover 2003 is connected to the box 2001, the second main body 60 is held against the snap member 20 to prevent it from rotating.

When the cover 2003 is connected to the box 2001 and the functional component 2005 is in the installation state, a stop portion 2025 is provided on one side of the functional component 2005 facing the second main body 60. By contacting the second main body 60 through the stop portion 2025, the present application can realize that the second main body 60 stops the snap member 20 from rotating in the direction of rotation of the snap member 20. When the cover 2003 is removed from the box 2001, the snap member 20 is rotated to disengage the stop portion 2025 from the second main body 60.

The snap member 20 and the cover 2003 are respectively held against both ends of the sliding member 30, while the snap member 20 is held against by the second main body 60, that is, the second main body 60 and the cover 2003 are respectively held against both ends of the sliding member 30, so that the sliding member 30 and the snap member 20 are fixed at the same time, thereby ensuring the stability of the position of the buckling device 100 within the chassis 200.

Figure 10:
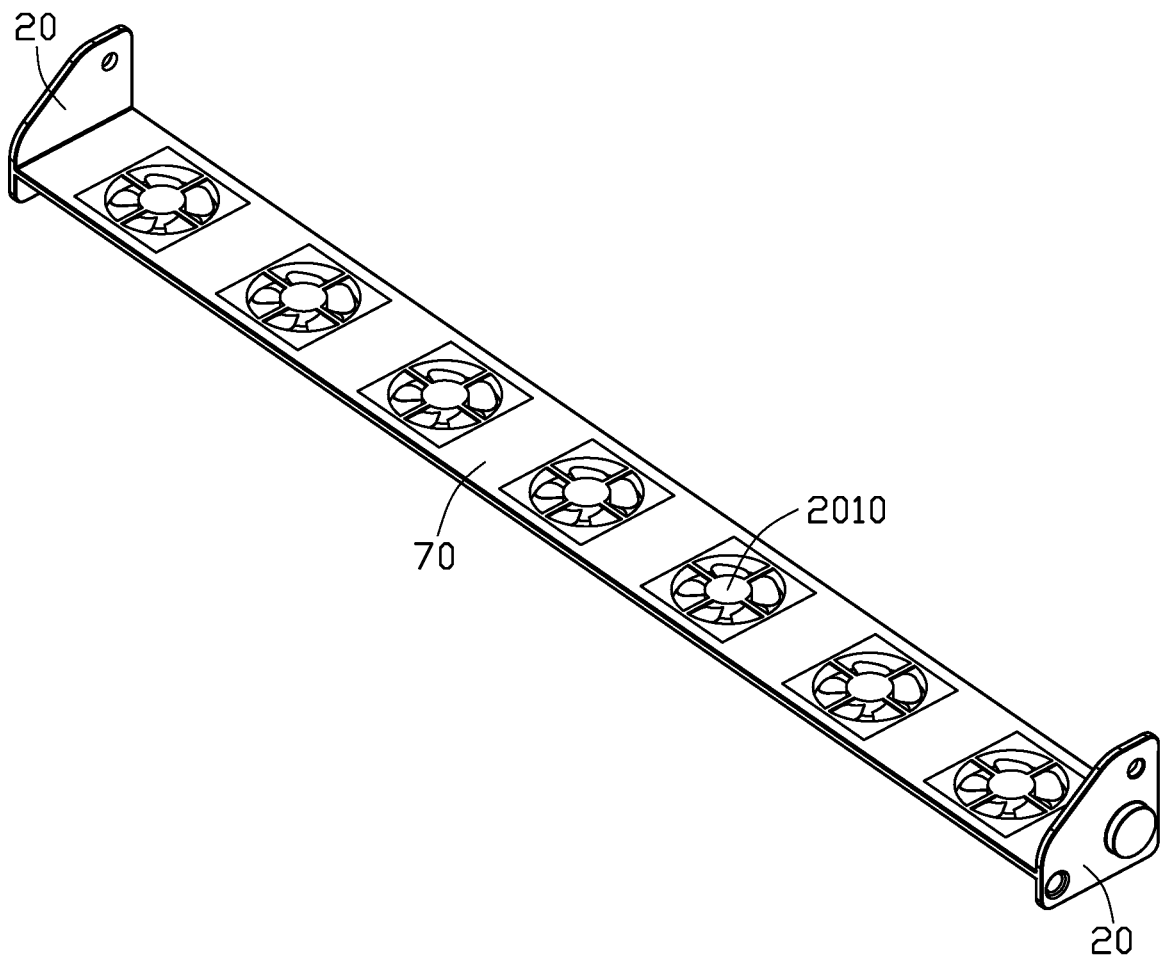
FIG. 10 is a schematic diagram of the buckling device including a supporting member in another embodiment according to an embodiment of the present disclosure.

In other embodiments, the functional component 2005 can be a fan 2010, display adapter, or expansion card, etc. For example, in another embodiment, as shown in FIG. 10, one of the two buckling devices 100 further includes a supporting member 70. The supporting member 70 is connected to the first main body 10 of two buckling devices 100. The fan 2010 is connected to the supporting member 70. When the fan 2010 needs to be avoided, the snap member 20 is rotated, and the snap member 20 is buckled onto the first main body 10, so that the sliding member 30 is in the first position. The position of the fan 2010 is changed so that an avoidance space is created in which operations such as repairing or disassembling the components in the box 2001 can be performed.

In one embodiment, the supporting member 70 and two first main bodies 10 are integrated into a formed structure.

In other embodiments, the present application can also prevent the snap member 20 from rotating by contacting the supporting member 70 with the second main body 60.

The two snap members 20 can improve the strength of the buckling device 100 to support the functional component 2005, and improve the uniformity of the force to support the functional component 2005, thereby improving the stability of the position of the functional component 2005, and avoiding the positional instability of the functional component 2005 that may cause accidental injuries to other components in the box 2001.

Figure 7:
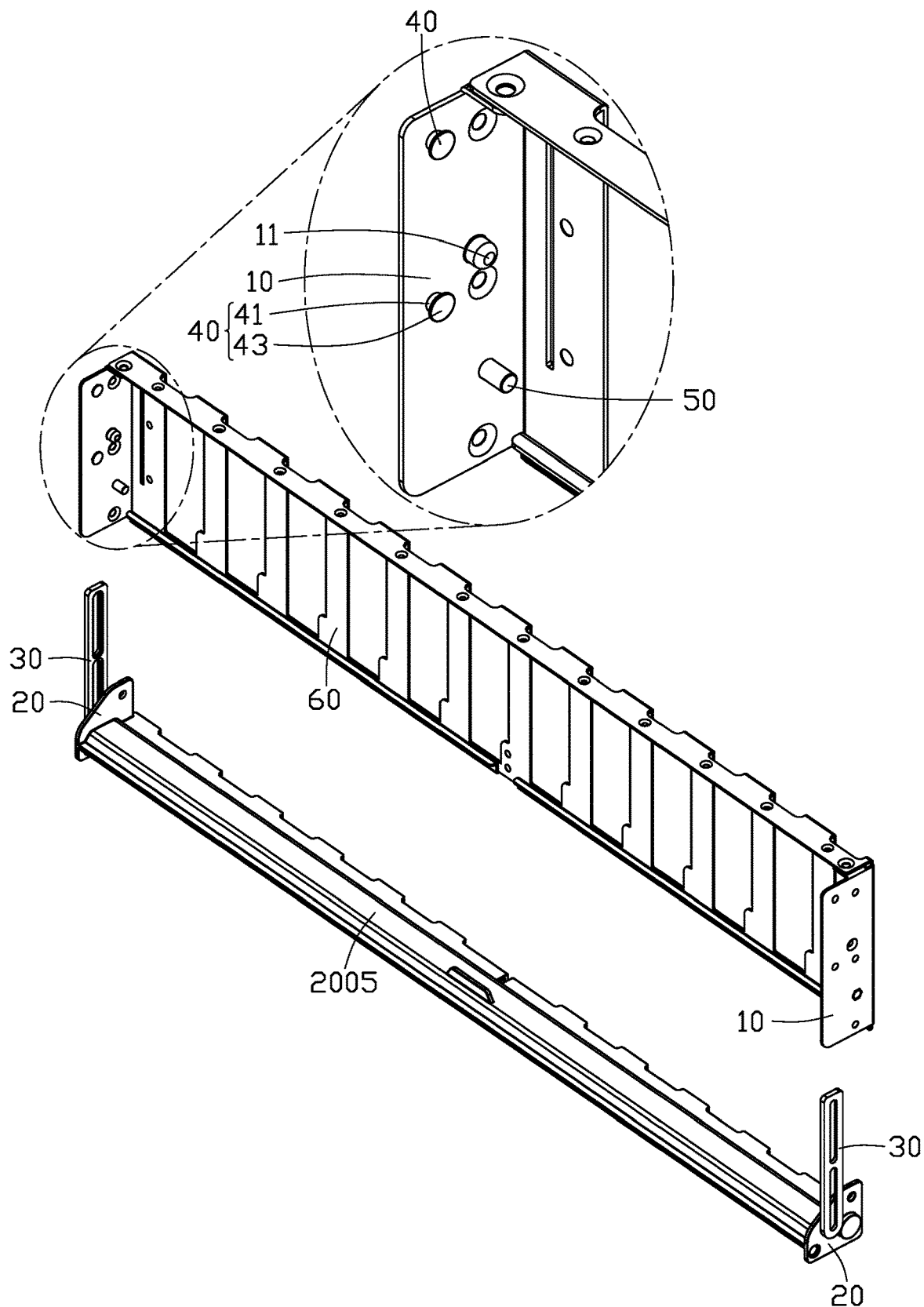
FIG. 7 is an exploded view of the buckling device according to an embodiment of the present disclosure.
Figure 8:
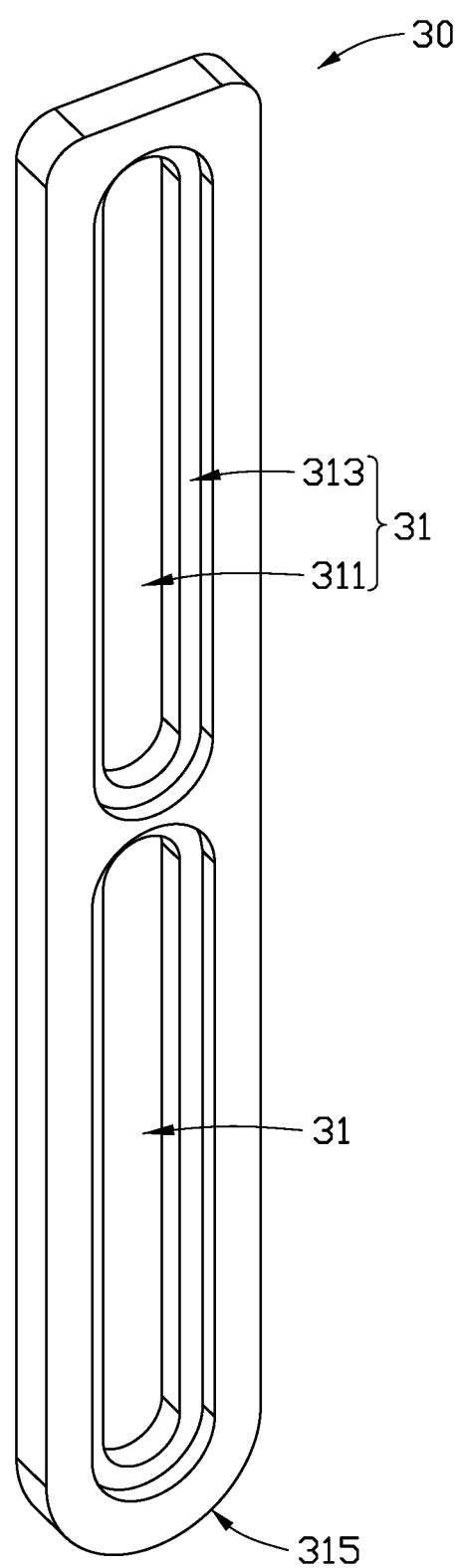
FIG. 8 is a schematic diagram of the sliding member of the buckling device according to an embodiment of the present disclosure.

Referring to FIG. 7 and FIG. 8, the buckling device 100 further includes a limiting member 40. The sliding member 30 defines a groove 31. The limiting member 40 is connected to the first main body 10 after passing through the groove 31, and the limiting member 40 can slide in the groove 31.

In other embodiments, the limiting member 40 may be disposed on the sliding member 30, and the first main body 10 defines a groove 31.

The buckling device 100 further includes a rotating shaft 50. The first main body 10 and the snap member 20 are rotationally connected by the rotating shaft 50. The rotating shaft 50 is offset from the sliding path of the sliding member 30.

The limiting member 40 and the groove 31 are easy to manufacture, have a simple structure, and achieve a sliding connection between the sliding member 30 and the first main body 10. The rotating shaft 50 realizes the rotational connection between the first main body 10 and the snap member 20. The rotating shaft 50 and the groove 31 are provided offset, the sliding member 30 and the snap member 20 are respectively connected to the first main body 10 at a spaced apart connection, which in turn enables the snap member 20 and the sliding member 30 to be conveniently connected to the first main body 10, respectively.

In one embodiment, the groove 31 includes a first groove 311 and a second groove 313. A positive projection of the first groove 311 on the first main body 10 is located within the positive projection of the second groove 313 on the first main body 10, and the first groove 311 is closer to the first main body 10 than the second groove 313. The limiting member 40 includes a connecting portion 41 and a limiting portion 43. The connecting portion 41 is configured to be connected to the first main body 10 through the first groove 311 and the second groove 313, and the limiting portion 43 is located in the second groove 313, and the limiting portion 43 stops on one side of the sliding member 30 away from the first main body 10.

The groove 31 is divided into a first groove 311 and a second groove 313 with different sizes, and the limiting member 40 is correspondingly provided with a connecting portion 41 and a limiting portion 43, which has a simple structure and is easy for the limiting member 40 to pass through the groove 31 and stop the sliding member 30 from the side away from the first main body 10.

In one embodiment, a plurality of grooves 31 can be spaced apart in the sliding member 30, and there is a plurality of limiting members 40, each limiting member 40 is connected to the first main body 10, and each limiting member 40 is slidably disposed within one groove 31.

The plurality of the grooves 31 are spaced apart in the sliding member 30, with a solid structure between adjacent grooves 31, thereby enhancing the strength of the sliding member 30.

In other embodiments, the number of the grooves 31 may be one.

Figure 9:
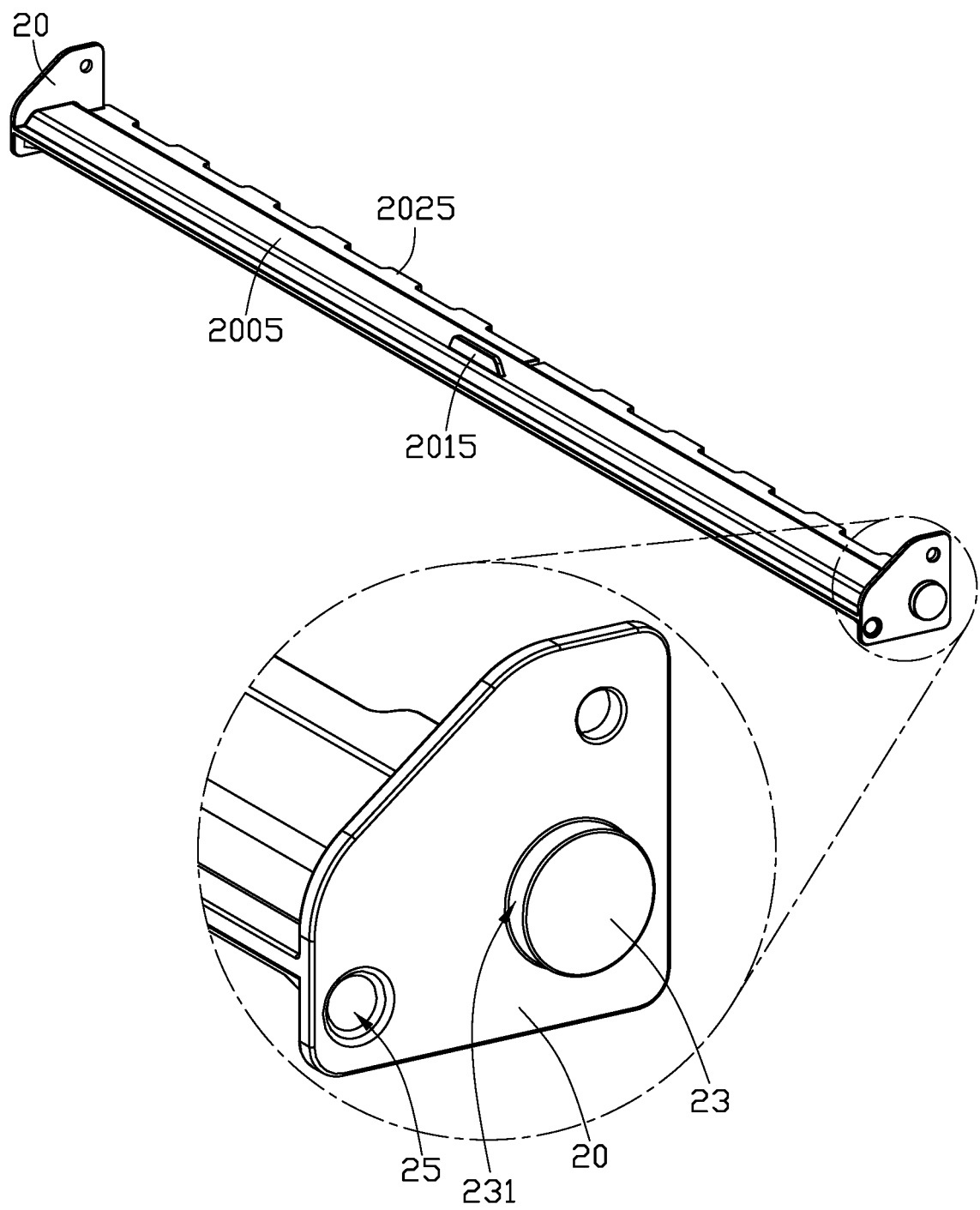
FIG. 9 is a schematic diagram of a snap member of the buckling device according to an embodiment of the present disclosure.

Referring to FIG. 7 and FIG. 9, the snap member 20 is provided with a restraining portion 23. The restraining portion 23 is spaced apart from the rotating shaft 50. A first arc surface 231 is provided on the peripheral side of the restraining portion 23, and a second arc surface 315 is provided on the peripheral wall of the sliding member 30. The first arc surface 231 is in contact and tangent to the second arc surface 315.

The restraining portion 23 is held against the peripheral wall of the sliding member 30, and the restraining portion 23 and the sliding member 30 can slide relative to each other, realizing that the snap member 20 rotates to drive the sliding member 30 to slide relative to the first main body 10, the peripheral wall of the sliding member 30 is in contact with the peripheral wall of the restraining portion 23, which is easy to achieve and improves the installation convenience of the restraining portion 23 and the sliding member 30.

In one embodiment, the first arc surface 231 is provided at one end of the sliding member 30 near the snap member 20, and the first arc surface 231 is a semi-circular surface. The restraining portion 23 is a cylindrical structure.

The first arc surface 231 is semi-circular surface, and the restraining portion 23 is a cylindrical structure, the circular surface is easy to process, and it is easy to ensure that the arc surface and the second arc surface 315 are tangent to improve the stability of the relative movement of the sliding member 30 and the snap member 20.

In other embodiments, the first arc surface 231 and the second arc surface 315 may also be omitted, for example, the restraining portion 23 is a rectangular block structure, and the restraining portion 23 is in contact with an outer peripheral wall of the sliding member 30, and the restraining portion 23 pushes against the sliding member 30 when the rotating member is rotated to slide the sliding member 30.

The sliding member 30 is disposed between the first main body 10 and the snap member 20. The snap member 20 defines a buckle hole 25, the first main body 10 is provided with a convex buckle 11, and the convex buckle 11 is engaged and connected to the buckle hole 25. The convex buckle 11 is disposed on one side of the first main body 10 facing the snap member 20.

The buckle hole 25 is defined on the snap member 20 and the convex buckle 11 is provided on the first main body 10, the position of the convex buckle 11 is fixed and will not move with the rotation of the snap member 20, and there is no need to leave a space between the sliding member 30 and the snap member 20 to avoid the convex buckle 11, thereby reducing the distance between the sliding member 30, the snap member 20 and the first main body 10.

The buckling device 100 is connected to the functional component 2005 through the snap member 20, and the snap member 20 is rotationally connected to the first main body 10. When the area near the functional component 2005 needs to be avoided, the snap member 20 is rotated to drive the functional component 2005 to rotate to expose the avoidance space. The functional component 2005 does not need to be disassembled from the box 2001, thus avoiding the problem of missing the functional component 2005 when reassembling the chassis 200 after avoidance. The snap member 20 is engaged and connected to the first main body 10, thereby allowing the buckling device 100 to fix the functional component 2005 and stably expose the avoidance space, the sliding member 30 extends out of the box 2001 and is visualized outside the box 2001 to remind the functional component 2005 to the avoidance state.

Referring to FIG. 7, the functional component 2005 is provided with a grip portion 2015, and the grip portion 2015 protrudes from the functional component 2005, thereby making it easier to grip and push or press down on the functional component 2005, to rotate the snap member 20 and slide the sliding member 30. In other embodiments, the grip portion 2015 may be omitted, or the grip portion 2015 may be provided on the snap member 20.

Those of ordinary skill in the art should realize that the above embodiments are only used to illustrate the present disclosure, but not to limit the present disclosure. As long as they are within the essential spirit of the present disclosure, the above embodiments are appropriately made and changes fall within the scope of protection of the present disclosure.

What is claimed is:

1. A buckling device comprising: a first main body configured to fix in a box; a snap member configured to connect a functional component; and a sliding member slidably connected to the first main body, wherein the snap member is rotatably connected to the first main body and the snap member is held against the sliding member such that the snap member is configured to drive the sliding member to slide during rotation, and the snap member is engaged and connected to the first main body when the sliding member protrudes at a first preset position outside the box; and the buckling device further comprises at least one limiting member, one of the first main body and the sliding member is connected and fixed to the limiting member, and another of the first main body and the sliding member is provided with at least one groove, and the limiting member is slidably disposed on the groove; and the buckling device further comprises a rotating shaft, the first main body and the snap member are rotationally connected through the rotating shaft, and the rotating shaft is offset from a sliding path of the sliding member; and the snap member is provided with a restraining portion, the restraining portion is spaced apart from the rotating shaft, a peripheral side of the restraining portion is provided with a first arc surface, an outer peripheral wall of the sliding member is provided with a second arc surface, and the first arc surface is in contact with and tangent to the second arc surface.

2. The buckling device of claim 1, wherein:
the groove includes a first groove and a second groove, a projection of the first groove on the first main body is located within a projection of the second groove on the first main body, and the first groove is closer to the first main body than the second groove; and
the limiting member comprises a connecting portion and a limiting portion, the connecting portion is configured to be connected to the first main body through the first groove and the second groove, and the limiting portion is located in the second groove and the limiting portion stops on one side of the sliding member away from the first main body.

3. The buckling device of claim 1, wherein a plurality of grooves is spaced apart on the sliding member, the buckling device further comprises a plurality of the limiting members, and each limiting member is connected to the first main body and slidably disposed within one groove.

4. The buckling device of claim 1, wherein the sliding member is disposed between the first main body and the snap member, the snap member defines a buckle hole, the first main body is provided with a convex buckle, and the convex buckle is buckled and connected to the buckle hole.

5. A buckling device comprising:
a first main body configured to fix in a box;
a snap member configured to connect a functional component;
a sliding member slidably connected to the first main body, and
wherein the snap member is rotatably connected to the first main body and the snap member is held against the sliding member such that the snap member is configured to drive the sliding member to slide during rotation, and the snap member is engaged and connected to the first main body when the sliding member protrudes at a first preset position outside the box,
wherein the buckling device further comprises at least one limiting member, one of the first main body and the sliding member is connected and fixed to the limiting member, and another of the first main body and the sliding member is provided with at least one groove, and the limiting member is slidably disposed on the groove, the buckling device further comprises a rotating shaft, the first main body and the snap member are rotationally connected through the rotating shaft, and the rotating shaft is offset from a sliding path of the sliding member, and
wherein the sliding member is disposed between the first main body and the snap member, the snap member defines a buckle hole, the first main body is provided with a convex buckle, and the convex buckle is buckled and connected to the buckle hole.

6. The buckling device of claim 5, wherein:
the groove includes a first groove and a second groove, a projection of the first groove on the first main body is located within a projection of the second groove on the first main body, and the first groove is closer to the first main body than the second groove; and
the limiting member comprises a connecting portion and a limiting portion, the connecting portion is configured to be connected to the first main body through the first groove and the second groove, and the limiting portion is located in the second groove and the limiting portion stops on one side of the sliding member away from the first main body.

7. The buckling device of claim 6, wherein a plurality of grooves is spaced apart on the sliding member, the buckling device further comprises a plurality of the limiting members, and each limiting member is connected to the first main body and slidably disposed within one groove.

8. The buckling device of claim 6, wherein the snap member is provided with a restraining portion, the restraining portion is spaced apart from the rotating shaft, a peripheral side of the restraining portion is provided with a first arc surface, an outer peripheral wall of the sliding member is provided with a second arc surface, and the first arc surface is in contact with and tangent to the second arc surface.

9. A chassis comprising a box, a functional component, and a buckling device, the first main body fixed inside the box, wherein the buckling device comprises: a first main body configured to fix in a box; a snap member configured to connect a functional component; and a sliding member slidably connected to the first main body, wherein the snap member is rotatably connected to the first main body and the snap member is held against the sliding member, such that the snap member is configured to drive the sliding member to slide during rotation, and the snap member is engaged and connected to the first main body when the sliding member protrudes at a first preset position outside the box; and the buckling device further comprises at least one limiting member, one of the first main body and the sliding member is connected and fixed to the limiting member, and another of the first main body and the sliding member is provided with at least one groove, and the limiting member is slidably disposed on the groove; and the buckling device further comprises a rotating shaft, the first main body and the snap member are rotationally connected through the rotating shaft, and the rotating shaft is offset from a sliding path of the sliding member; and the chassis further comprises a cover, the cover is connected to the box, and the cover is pressed and fixed the sliding member.

10. The chassis of claim 9, wherein:
the groove includes a first groove and a second groove, a projection of the first groove on the first main body is located within a projection of the second groove on the first main body, and the first groove is closer to the first main body than the second groove; and
the limiting member comprises a connecting portion and a limiting portion, the connecting portion is configured to be connected to the first main body through the first groove and the second groove, and the limiting portion is located in the second groove and the limiting portion stops on one side of the sliding member away from the first main body.

11. The chassis of claim 9, wherein a plurality of grooves is spaced apart on the sliding member, the buckling device further comprises a plurality of the limiting members, and each limiting member is connected to the first main body and slidably disposed within one groove.

12. The chassis of claim 9, wherein the snap member is provided with a restraining portion, the restraining portion is spaced apart from the rotating shaft, a peripheral side of the restraining portion is provided with a first arc surface, an outer peripheral wall of the sliding member is provided with a second arc surface, and the first arc surface is in contact with and tangent to the second arc surface.

13. The chassis of claim 9, wherein the sliding member is disposed between the first main body and the snap member, the snap member defines a buckle hole, the first main body is provided with a convex buckle, and the convex buckle is buckled and connected to the buckle hole.

\* \* \* \* \*